(12) United States Patent
Kellerman et al.

(10) Patent No.: US 8,129,695 B2
(45) Date of Patent: Mar. 6, 2012

(54) SYSTEM AND METHOD FOR CONTROLLING DEFLECTION OF A CHARGED PARTICLE BEAM WITHIN A GRADED ELECTROSTATIC LENS

(75) Inventors: Peter L. Kellerman, Essex, MA (US); Frank Sinclair, Quincy, MA (US); Victor Benveniste, Lyle, WA (US); Jun Lu, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 249 days.

(21) Appl. No.: 12/647,950

(22) Filed: Dec. 28, 2009

(65) Prior Publication Data

US 2011/0155921 A1    Jun. 30, 2011

(51) Int. Cl.
*G21K 1/06* (2006.01)
(52) U.S. Cl. .............. 250/396 R; 355/53; 345/173
(58) Field of Classification Search .......... 250/396 R
See application file for complete search history.

(56) References Cited

U.S. PATENT DOCUMENTS

| 3,710,103 | A  | * | 1/1973  | Helmer ................ 250/305 |
| 7,456,931 | B2 | * | 11/2008 | De Winter et al. .......... 355/53 |
| 7,462,838 | B2 | * | 12/2008 | Sasaki ................. 250/396 R |
| 7,888,653 | B2 | * | 2/2011  | Kellerman et al. ....... 250/396 R |

FOREIGN PATENT DOCUMENTS

EP       1691395 A1   8/2006
WO    2010077418 A1   7/2010

* cited by examiner

*Primary Examiner* — Phillip A Johnston

(57) ABSTRACT

A method and apparatus for controlling deflection, deceleration, and focus of an ion beam are disclosed. The apparatus may include a graded deflection/deceleration lens including a plurality of upper and lower electrodes disposed on opposite sides of an ion beam, as well as a control system for adjusting the voltages applied to the electrodes. The difference in potential between pairs of upper and lower electrodes are varied using a set of "virtual knobs" that are operable to independently control deflection and deceleration of the ion beam. The virtual knobs include control of beam focus and residual energy contamination, control of upstream electron suppression, control of beam deflection, and fine tuning of the final deflection angle of the beam while constraining the beam's position at the exit of the lens. In one embodiment, this is done by fine tuning beam deflection while constraining the beam position at the exit of the VEEF. In another embodiment, this is done by fine tuning beam deflection while measuring the beam position and angle at the wafer plane. In a further embodiment, this is done by tuning a deflection factor to achieve a centered beam at the wafer plane.

19 Claims, 14 Drawing Sheets

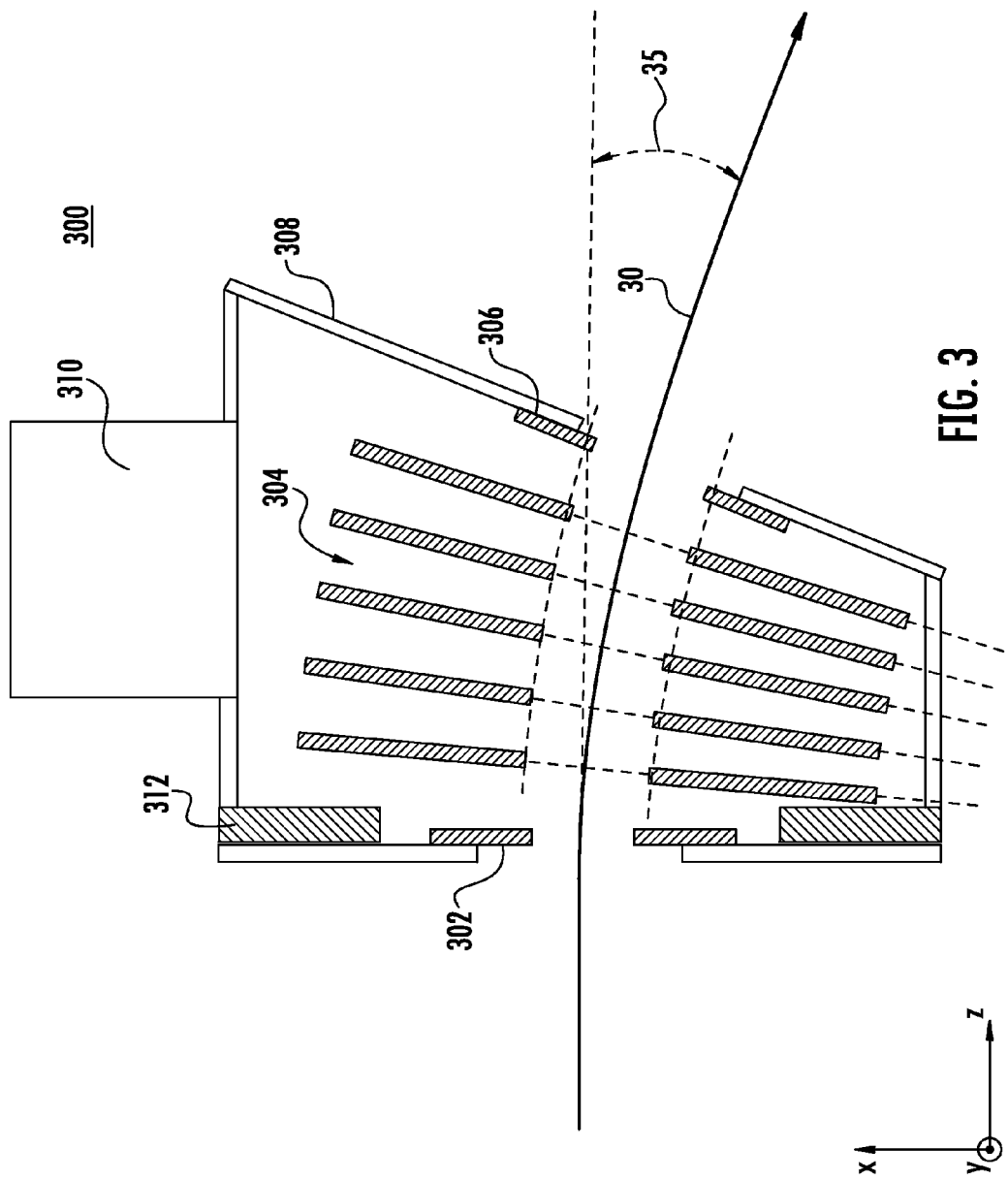

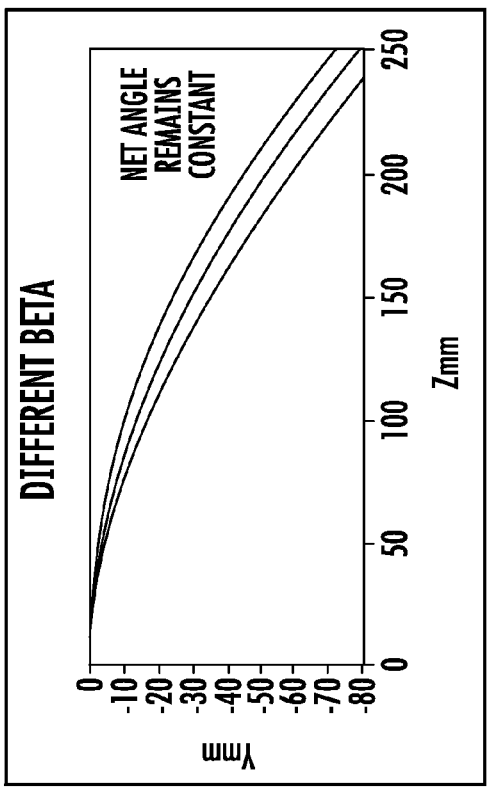
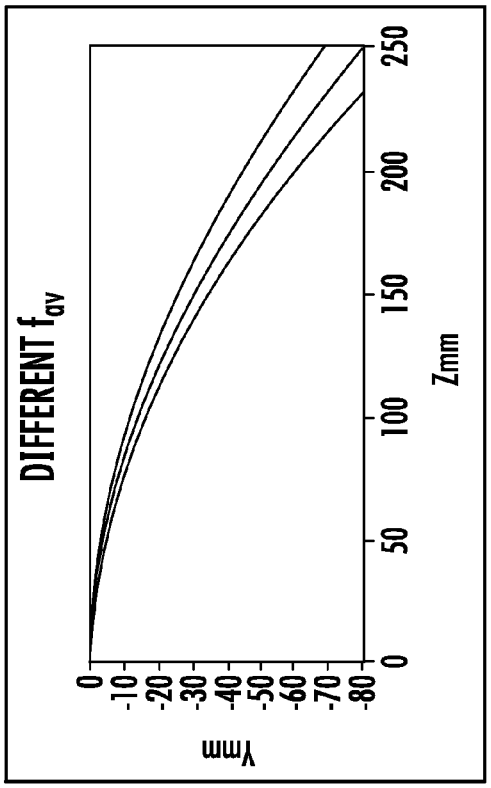
FIG. 9A
FIG. 9B

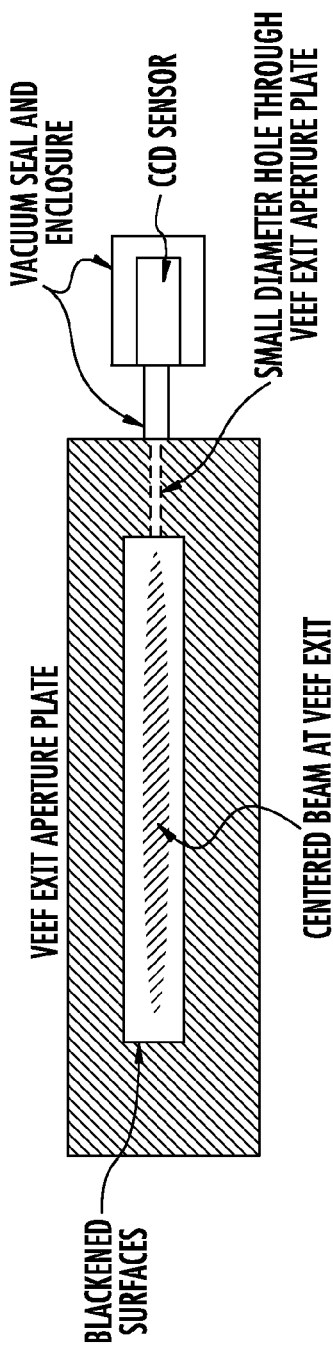
FIG. 14
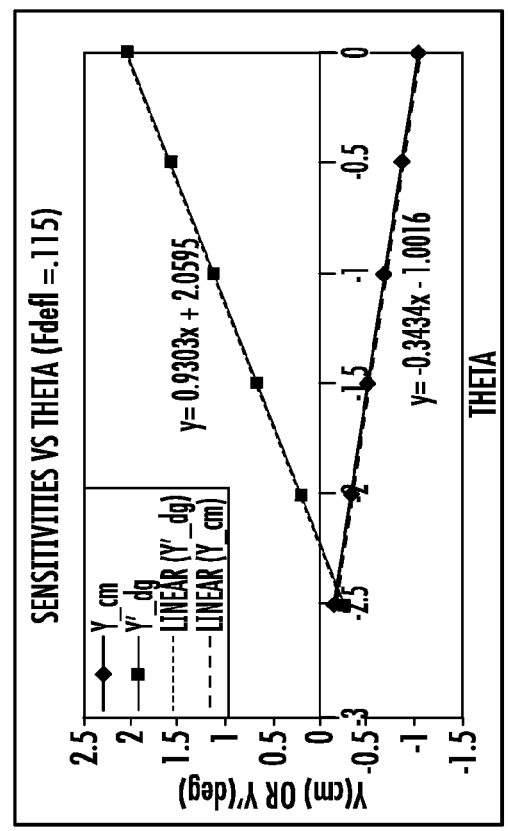
FIG. 15B
FIG. 15A

SYSTEM AND METHOD FOR CONTROLLING DEFLECTION OF A CHARGED PARTICLE BEAM WITHIN A GRADED ELECTROSTATIC LENS

BACKGROUND OF THE INVENTION

1. Field of the Invention

Embodiments of the invention relate to the field of ion implantation for forming semiconductor structures. More particularly, the present invention relates to a method for controlling deflection of a charged particle beam within a graded electrostatic lens.

2. Discussion of Related Art

Ion implanters are widely used in semiconductor manufacturing to selectively alter conductivity of materials. In a typical ion implanter, ions generated from an ion source are directed through a series of beam-line components that may include one or more analyzing magnets and a plurality of electrodes. The analyzing magnets select desired ion species, filter out contaminant species and ions having undesirable energies, and adjust ion beam quality at a target wafer. Suitably shaped electrodes may modify the energy and the shape of an ion beam.

FIG. 1 shows a conventional ion implanter 100 which comprises an ion source 102, extraction electrodes 104, a 90° magnet analyzer 106, a first deceleration (D1) stage 108, a 70° magnet analyzer 110, and a second deceleration (D2) stage 112. The D1 and D2 deceleration stages (also known as "deceleration lenses") are each comprised of multiple electrodes with a defined aperture to allow an ion beam to pass therethrough. By applying different combinations of voltage potentials to the multiple electrodes, the D1 and D2 deceleration lenses can manipulate ion energies and cause the ion beam to hit a target wafer at a desired energy.

The above-mentioned D1 or D2 deceleration lenses are typically electrostatic triode (or tetrode) deceleration lenses. FIG. 2 shows a perspective view of a conventional electrostatic triode deceleration lens 200. The electrostatic triode deceleration lens 200 comprises three sets of electrodes: entrance electrodes 202 (also referred to as "terminal electrodes"), suppression electrodes 204 (or "focusing electrodes"), and exit electrodes 206 (also referred to as "ground electrodes" though not necessarily connected to earth ground). A conventional electrostatic tetrode deceleration lens is similar to the electrostatic triode deceleration lens 200, except that a tetrode lens has an additional set of suppression electrodes (or focusing electrodes) between the suppression electrodes 204 and the exit electrodes 206. In the electrostatic triode deceleration lens 200, each set of electrodes may have a space/gap to allow an ion beam 20 to pass therethrough (e.g., in the +z direction along the beam direction). As shown in FIG. 2, each set of electrodes may include two conductive pieces electrically coupled to each other to share a same voltage potential. Alternatively, each set of electrodes may be a one-piece structure with an aperture for the ion beam 20 to pass therethrough. As such, each set of electrodes are effectively a single electrode having a single voltage potential. For simplicity, each set of electrodes are herein referred to in singular. That is, the entrance electrodes 202 are referred to as an "entrance electrode 202," the suppression electrodes 204 are referred to as a "suppression electrode 204," and the exit electrodes 206 are referred to as an "exit electrode 206."

In operation, the entrance electrode 202, the suppression electrode 204, and the exit electrode 206 are independently biased such that the energy and/or shape of the ion beam 20 is manipulated in the following fashion. The ion beam 20 may enter the electrostatic triode deceleration lens 200 through the entrance electrode 202 and may have an initial energy of, for example, 10-20 keV. Ions in the ion beam 20 may be accelerated between the entrance electrode 202 and the suppression electrode 204. Upon reaching the suppression electrode 204, the ion beam 20 may have an energy of, for example, approximately 30 keV or higher. Between the suppression electrode 204 and the exit electrode 206, the ions in the ion beam 20 may be decelerated, typically to an energy that is closer to the one used for ion implantation of a target wafer. In one example, the ion beam 20 may have an energy of approximately 3-5 keV or lower when it exits the electrostatic triode deceleration lens 200.

The significant changes in ion energies that take place in the electrostatic triode deceleration lens 200 may have a substantial impact on a shape of the ion beam 20. For example, the deceleration lens 200, which may provide co-local deflection for filtering energetic neutrals, may face challenges associated with control of deflection angle and beam focus. Voltage needed to control deflection of the ion beam 20 may depend on the energy of the beam (e.g., both input and output), whereas voltage to control focus of the ion beam 20 may be varied to accommodate ion beams with different current and height. This may lead to difficulty in tuning the ion beam 20 since tuning the size of the ion beam 20 (focus) may not be readily feasible if a position of the ion beam 20 also continues to vary. Conventional systems and methods do not provide a solution for independently controlling the deflection and/or focus of an ion beam in a co-locally deflecting and decelerating lens. In view of the foregoing, it may be understood that there are significant problems and shortcomings associated with current ion implantation technologies.

SUMMARY OF THE INVENTION

A method is disclosed for assigning electrode voltages within a decel/deflect lens which maintains an arcuate motion of the beam, matching the symmetry of the graded decel/deflect lens. Small adjustment of deflect angle is accomplished smoothly, via small adjustments of the voltages throughout lens, rather than abruptly at end of lens. The vertical position can be constrained at the exit of the lens, or at the wafer plane, allowing the position and angle of the beam at the wafer to be tuned independently. Several methods of incorporating beam vertical position detection within the Vertical Electrostatic Energy Filter (VEEF) are disclosed.

A method is disclosed for controlling deflection of an ion beam, comprising: providing an electrode configuration comprising a plurality of upper and lower electrode pairs, the upper and lower electrodes of each pair positioned on opposite sides of an ion beam; grading a deceleration of the ion beam, obtaining a deflection factor function along a length of the lens to obtain a beam angle correction; and obtaining electrode voltages for the plurality of upper and lower electrode pairs to adjust the grading, the deflection factor, and a focus of the ion beam such that a central ray trajectory (CRT) of the ion beam is positioned at a center of the lens center; wherein adjusting the grading and deflection factor is achieved using at least one virtual knob that adjusts at least one parameter of the ion beam.

A system for controlling deflection of a charged particle beam, comprising: a graded lens comprising a plurality of sets of electrodes, each set of electrodes spaced apart by a gap to allow a charged particle beam to pass therebetween; and a controller for controlling different combination of voltage potentials to be applied to the plurality of sets of electrodes, a machine readable storage medium encoded with a computer program code such that, when the computer program code is executed by a processor, the processor performs a method. The method comprises: grading a deceleration of the ion beam, obtaining a deflection factor function along a length of the lens to obtain a beam angle correction; and obtaining electrode voltages for the plurality of upper and lower electrode pairs to adjust the grading, the deflection factor, and a focus of the ion beam such that a central ray trajectory (CRT) of the ion beam is positioned at a center of the lens center; wherein adjusting the grading and deflection factor is achieved using at least one virtual knob that adjusts at least one parameter of the ion beam.

BRIEF DESCRIPTION OF THE DRAWINGS

The accompanying drawings illustrate preferred embodiments of the disclosed method so far devised for the practical application of the principles thereof, and in which:

FIG. 3 depicts a side view of a graded lens configuration;

FIGS. 9A and 9B are graphs illustrating the effect of varying $f_{av}$ and $\beta$ over the length of a lens of 150 millimeters;

FIG. 14 is a schematic illustration of an arrangement for measuring vertical position of an ion beam;

FIGS. 15A and 15B are graphs illustrating the response/sensitivities of average vertical position and average vertical angles vs. $F_{defl}$ and $\theta cor$.

DESCRIPTION OF EMBODIMENTS

Figure 1:
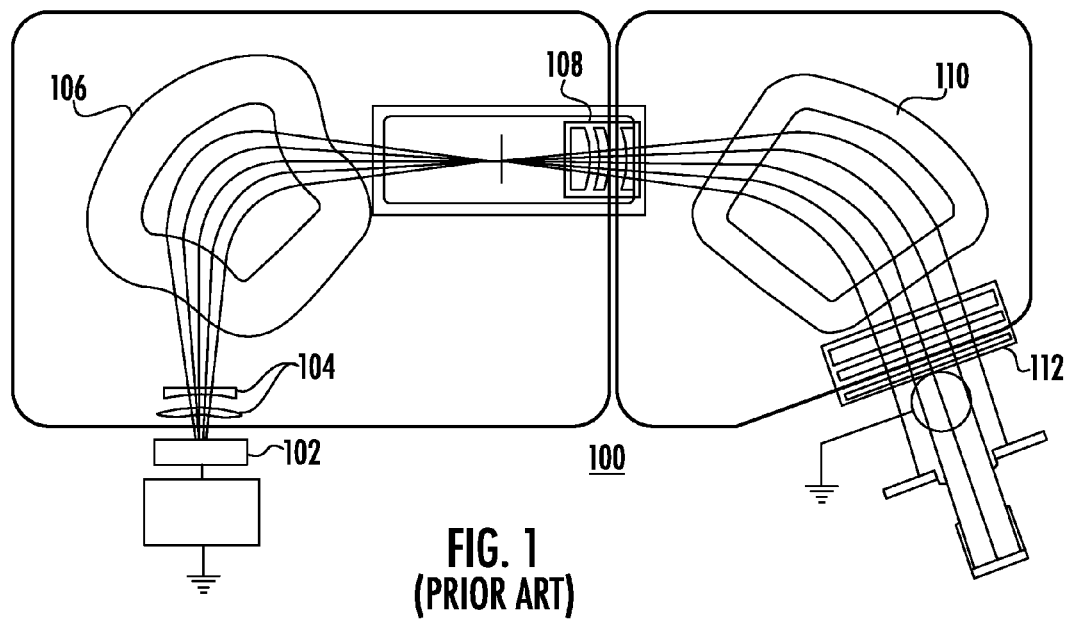
FIG. 1 depicts a conventional ion implanter.
Figure 2:
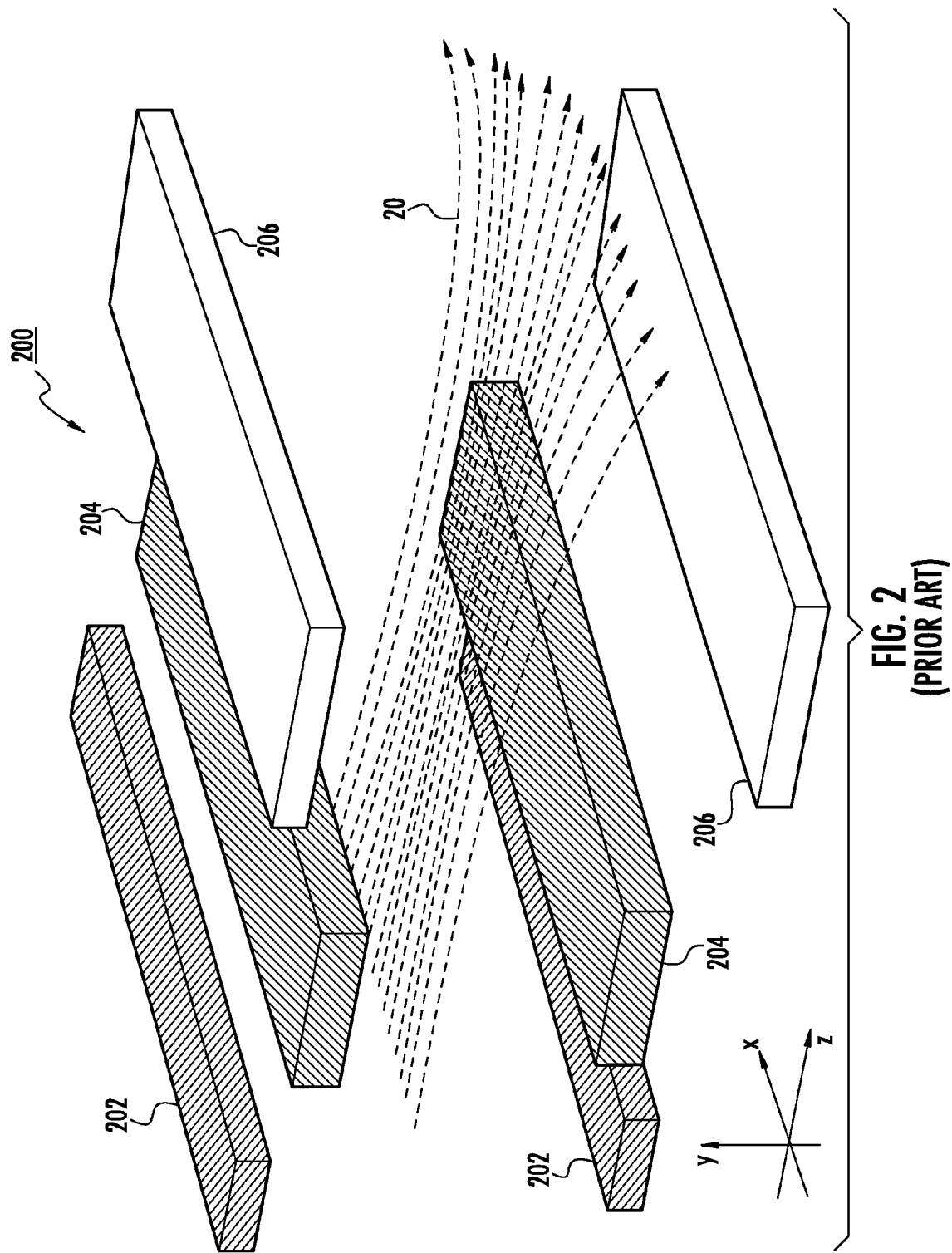
FIG. 2 depicts a conventional electrostatic triode lens.

To solve the problems with conventional lens configurations, an improved electrostatic lens configuration may include one or more variable-control suppression/focusing electrodes. These electrodes may include a variety of shapes, curvatures, positions, materials, and/or configurations that are independently or separately controlled/biased with respect to one another thereby providing flexible and effective manipulation of an ion beam's shape as well as its energy.

FIG. 3 depicts a side view of an exemplary graded lens configuration 300. The graded lens configuration 300 may include several sets of electrodes. For example, the graded lens configuration may include a set of entrance electrodes 302, one or more sets of suppression/focusing electrodes 304, and a set of exit electrodes 306. Each set of electrodes may have a space/gap to allow an ion beam 30 (e.g., a ribbon beam) to pass therethrough.

In some embodiments, these electrodes (e.g., entrance electrode 302, suppression/focusing electrodes 304, and the exit electrode 306) may be provided in a housing 308. A pump 310 may be directly or indirectly connected to the housing 308. In one embodiment, the pump 310 may be a vacuum pump for providing a high-vacuum environment or other controlled environment. In other embodiments, the housing 308 may include one or more bushings 312. These bushings 312 may be used to electrically isolate the housing 308 from other components. Other various embodiments may also be provided.

As shown in FIG. 3, each set of entrance electrodes 302 and exit electrodes 306 may include two conductive pieces electrically coupled to each other or may be a one-piece structure with an aperture for the ion beam 30 to pass therethrough. In some embodiments, upper and lower portions of suppression/focusing electrodes 304 may have different potentials (e.g., in separate conductive pieces) in order to deflect the ion beam 30 passing therethrough. For simplicity, each set of electrodes may be referred to in singular. That is, the entrance electrodes 302 may be referred to as an "entrance electrode 302," the suppression/focusing electrodes 304 may be referred to as a "suppression/focusing electrode 304," and the exit electrodes 306 may be referred to as an "exit electrode 306." Although the graded lens configuration 300 is depicted as a seven (7) element lens configuration (e.g., with five (5) sets of suppression/focusing electrodes 304), it should be appreciated that any number of elements (or electrodes) may be utilized. For example, in some embodiments, the graded lens configuration 300 may utilize a range of three (3) to ten (10) electrode sets. Other various embodiments may also be provided. In some embodiments, the ion beam 30 passing through the electrodes may include boron or other elements. Electrostatic focusing of the ion beam 30 may be achieved by using several thin electrodes (e.g., the suppression/focusing electrodes 304) to control grading of potential along an ion beam path or beamline 30. In the graded lens configuration 300, high deceleration ratios may also be provided while avoiding overfocusing.

As a result, use of input ion beams 30 may be used in an energy range that may enable higher quality beams, even for very low energy output beams. In one embodiment, as the ion beam 30 passes through the electrodes of the lens configuration 300, the ion beam 30 may be decelerated from 6 keV to 0.2 keV and deflected at 15° by the electrodes of the graded lens configuration 300. In this example, the energy ratio may be 30/1. Other various embodiments may also be provided.

It should be appreciated that separating and independently controlling deceleration, deflection, and/or focus may be accomplished by: (1) maintaining symmetry of electrodes (e.g., the entrance electrode 302, suppression/focusing electrodes 304, and the exit electrode 306) with respect to a central ray trajectory ("CRT") of the ion beam 30, and (2) varying deflection voltages along the CRT of the ion beam 30 to reflect beam energy at each point along the CRT at a deflection angle 35. By symmetry of the electrodes with respect to the CRT of the ion beam 30, it should be appreciated that the ends of upper and lower electrodes closest to the ion beam 30 may be maintained at equal (or near equal) perpendicular distances from the CRT of the ion beam 30. For example, a difference in voltages on electrodes above and below the ion beam 30 (e.g., $V_{def}(z)=V_{upper}(z)-V_{lower}(z)$) may be configured so that a deflection component of the electric field (e.g., $(V_{upper}(z)-V_{lower}(z))/gap(z)$) may be a fixed ratio/factor of the beam energy at that point (which may vary along the electrodes or lenses) (e.g., factor*$E_{beam}(z)$). For example, this may be expressed as Equation 1 below:

$$V_{defl}(z)/gap(z) = factor * E_{beam}(z) \qquad \text{Eq. 1}$$

In some embodiments, this deflection voltage may be applied anti-symmetrically above and/or below (e.g., $+/-V_{defl}(z)$ relative to the potential at the crt at that z). In other embodiments, for example, the deflection voltage may be applied to just one side of the ion beam 30 with twice the deflection voltage. It should be appreciated that since the relationship between the top and bottom electrode voltage may be fixed for a given geometry, it may be possible to implement this relationship in a circuit network or other similar network. Accordingly, a need for doubling the number of power supplies and/or fixing this relationship in hardware may be reduced, if not completely eliminated. Other various embodiments may also be provided.

Figure 4A:
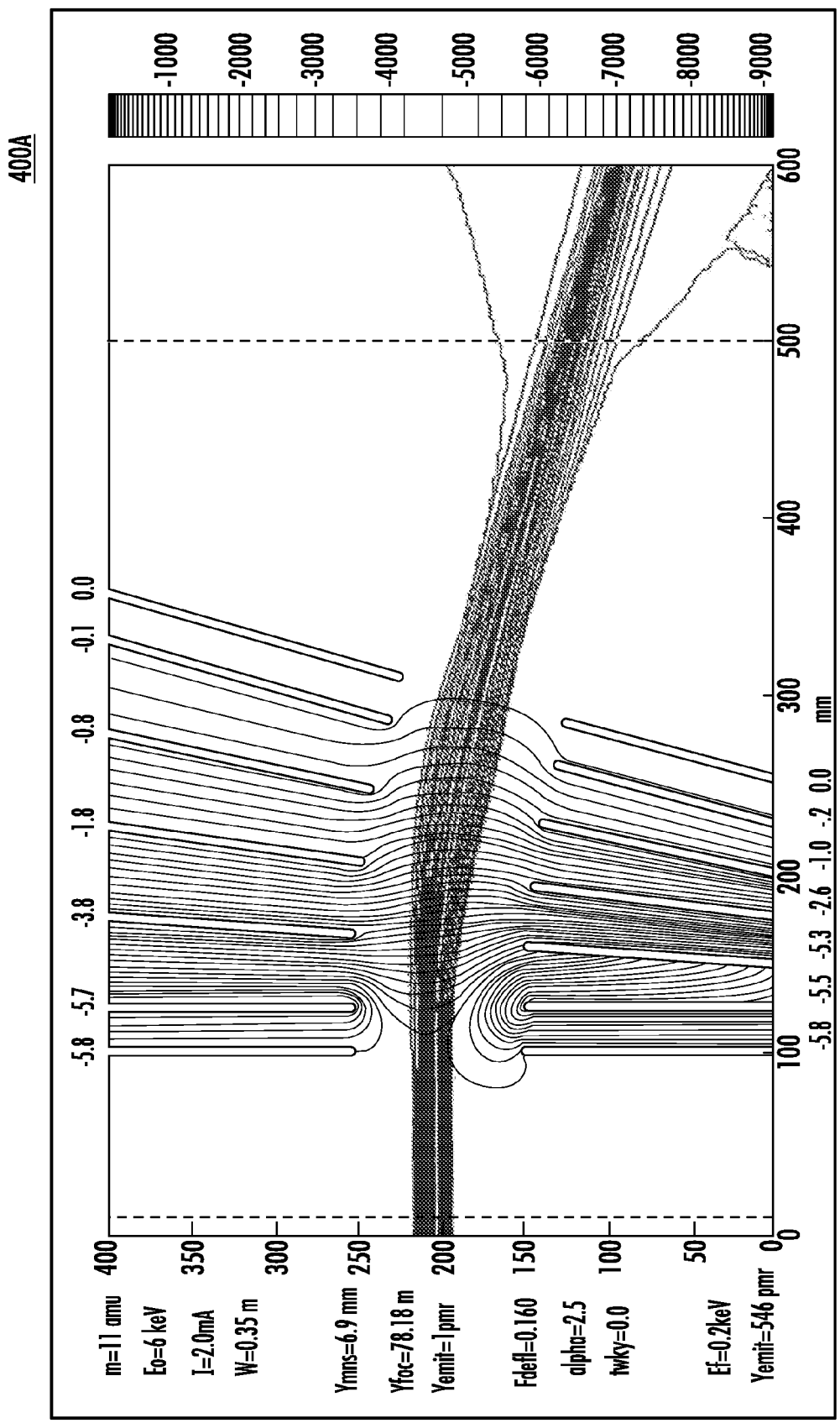
FIGS. 4A-4D depict illustrative graphs of deflection, deceleration, and/or focus in a graded lens configuration.
Figure 4B:
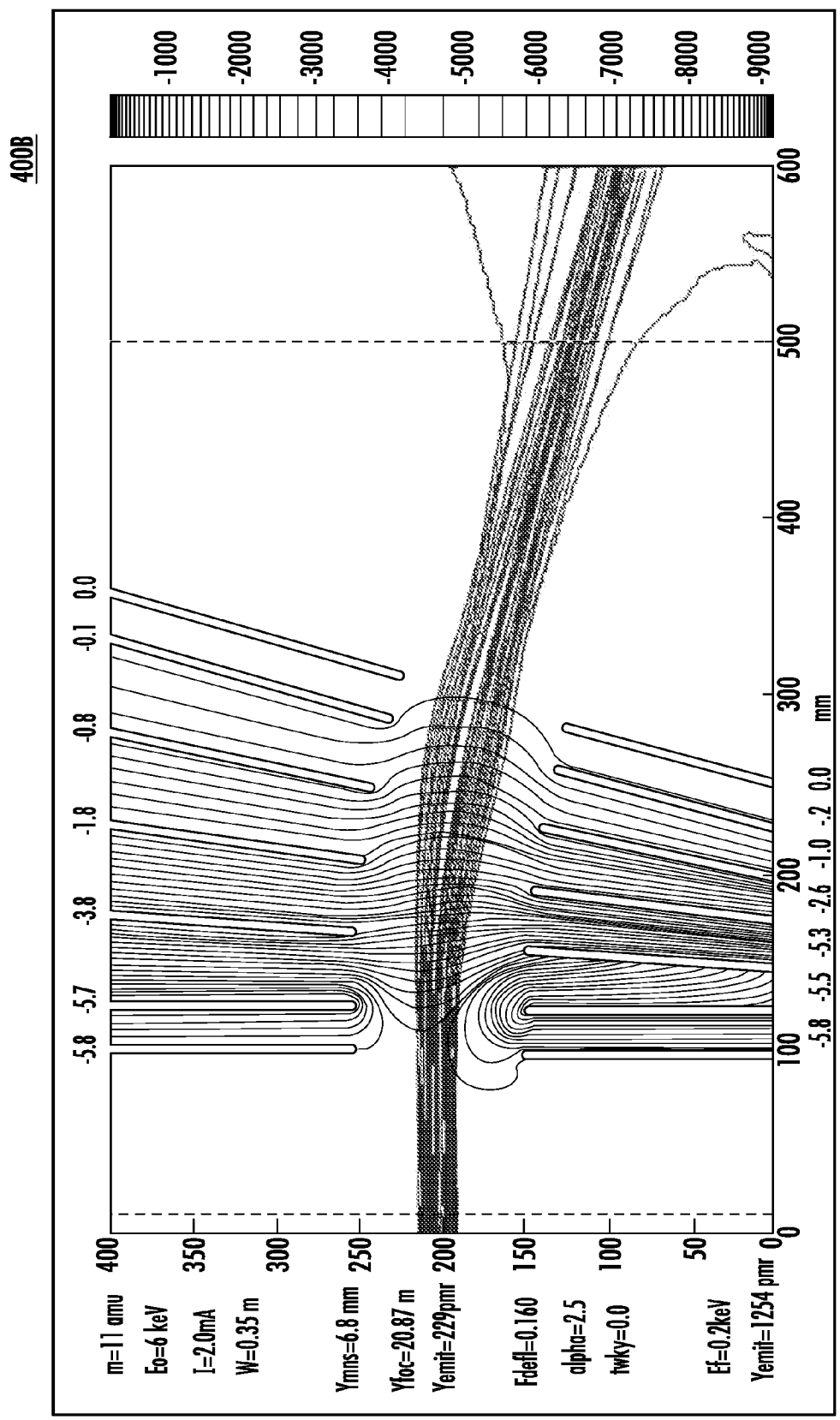
Figure 4C:
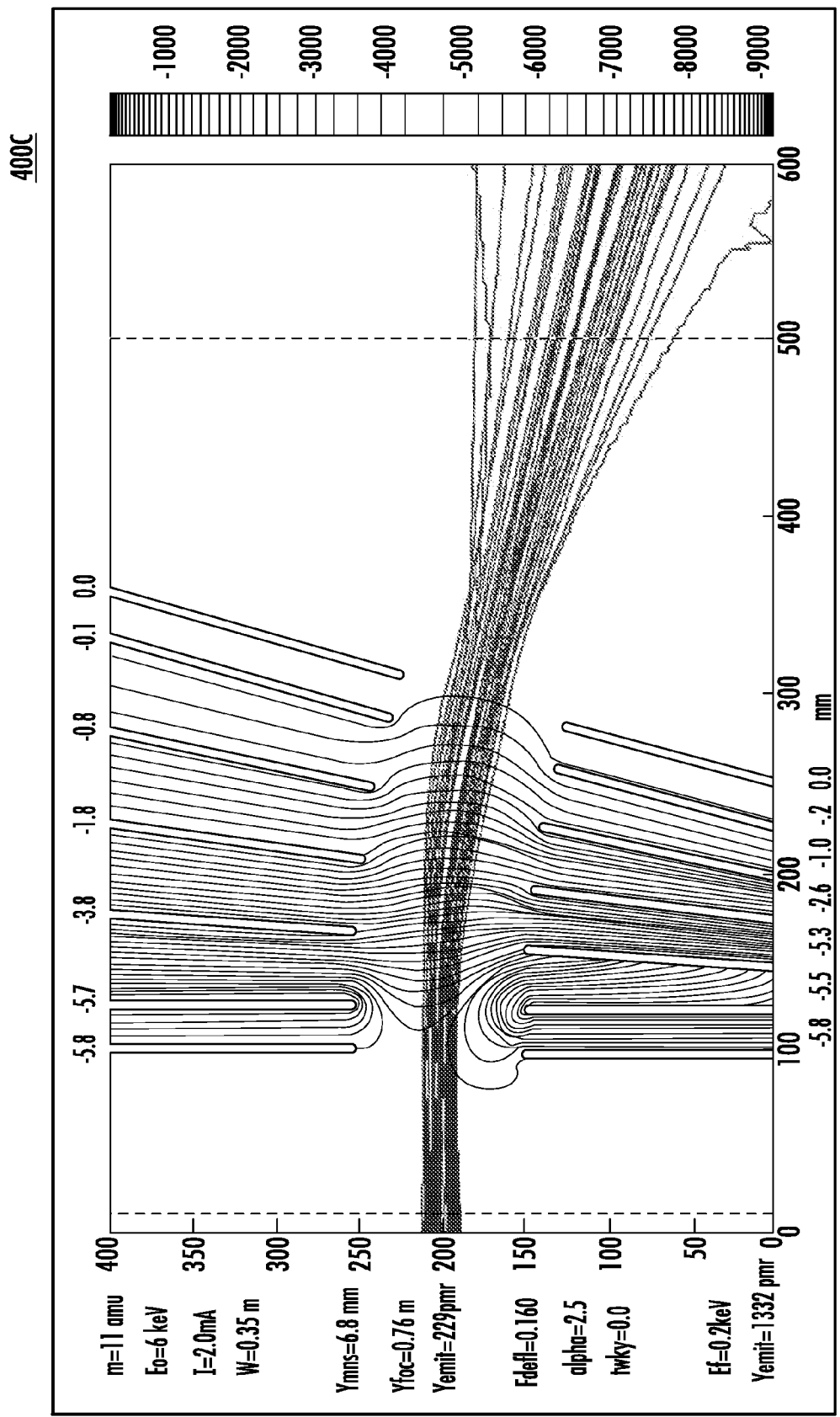
Figure 4D:
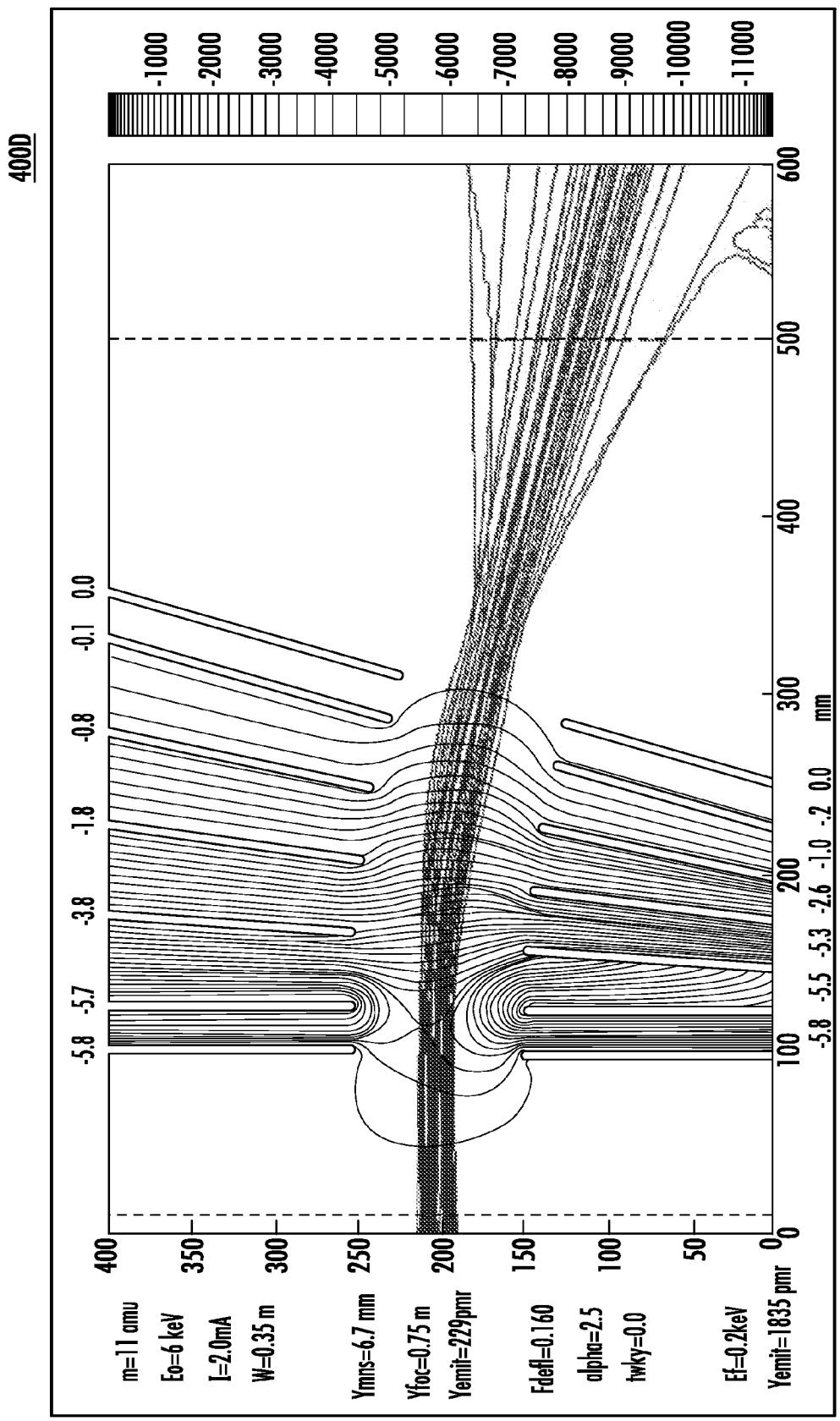

FIGS. 4A-4D depict illustrative graphs 400A-400D of deflection, deceleration, and/or focus in a graded lens configuration in accordance with the exemplary embodiment of FIG. 3. In these illustrative graphs 400A-400D, the ion beam 30 may be depicted with differing emittance and voltages/bias at each electrode producing various focus conditions. It should be appreciated that each exemplary graph may use a deflection factor (as described above in Eq. 1) of 0.16 and may produce the same or similar a deflection (e.g., deflection of 20°). For example, FIG. 4A depicts an illustrative graph 400A of deflection, deceleration, and/or focus in a graded lens configuration using a zero (0) emittance ion beam, FIG. 4B depicts an illustrative graph 400B of deflection, deceleration, and/or focus in a graded lens configuration using a non-zero emittance ion beam, FIG. 4C depicts an illustrative graph 400C of deflection, deceleration, and/or focus in a graded lens configuration using a non-zero emittance ion beam with convergence, and FIG. 4D depicts an illustrative graph 400D of deflection, deceleration, and/or focus in a graded lens configuration situations, using different focus voltages. In most situations, the deflection factor of Eq. 1 may be maintained as 0.16. Other various embodiments may also be provided.

It will also be appreciated that other graded lens configurations may be provided, such as those disclosed in co-pending application Ser. No. 12/348,091, filed Jan. 2, 2009, titled, "Techniques for Independently Controlling Deflection, Deceleration and Focus of an Ion Beam," the entirety of which application is incorporated by reference herein.

As noted, a graded deceleration-deflect electrostatic lens contains many electrodes, each connected to separate power supplies. For example, a 7-stage lens will typically require 10 high voltage power supplies (in addition to the main deceleration supply). The electrode voltages must be varied together to achieve: (1) grading of the deceleration to control beam focus; (2) centering of the beam's central ray trajectory (CRT) on the lens center line, (3) adjustment of the beam's final deflection angle; and (4) minimization of energy contamination.

The above should be achieved while maintaining the constraint that all electrode voltages remain negative with respect to the upstream beam-line to prevent electron currents.

Controlling this large number of power supplies is a significant controls challenge. A method is therefore disclosed for combining these power supply controls to yield a small number of "virtual knobs" that directly reflect the goals stated above. Such a re-parameterization simplifies, and enables the control of, this complex device.

Figure 5:
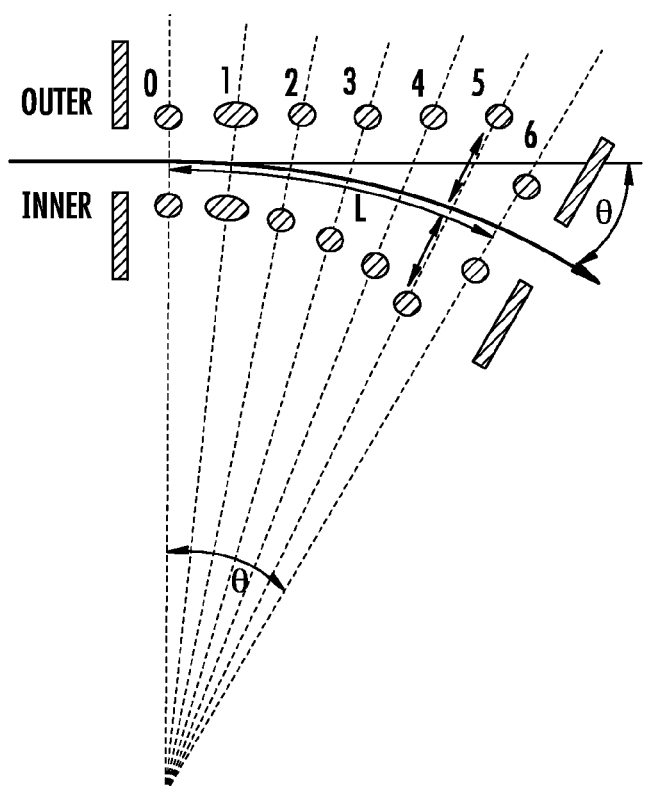
FIG. 5 is a geometric representation of an exemplary graded lens configuration.

The disclosed method refers to assigning voltages to the electrodes of an electrostatic lens capable of independently decelerating and deflecting an ion beam (also referred to as a "Vertical Electrostatic Energy Filter", or VEEF). This geometry, which is shown schematically in FIG. 5 contains 7 inner and outer electrodes (numbered 0 through 6), centered about a 20-degree deflection arc θ. In this example, the positions of the electrodes are fanned (so that high energy neutrals from the input beam will not hit the high voltage electrodes), and the angular spacing of the electrodes is uniform. The first electrodes "0" (inner and outer) are tied to the upstream (high energy) beamline, and the last electrodes "6" (inner and outer) are tied to the downstream (low energy beamline). The difference in potential between the upstream and downstream beamlines is the deceleration voltage of the lens. In the disclosed embodiment, there are additionally 10 other power supplies connected to the other electrodes, the difference in voltage between the inner and outer electrodes (at a particular position along the deflection arc) is proportional to the energy of the beam's CRT at that point. The constant of proportionality between the deflection voltage difference and the CRT energy is referred to as the deflection factor $F_{defl}$.

The techniques for assigning voltages to such a graded deflect/decel electrostatic lens or VEEF involves several aspects:

1. A method for assigning electrode voltages (based on a few "virtual knobs")
   a. Grading the deceleration, which entails calculating the energy of the beam's CRT along the lens,
   b. Calculating the deflection factor function along the lens to achieve an angle correction (beyond the geometric angle of the lens geometry),
   c. Calculating the electrode voltages to achieve the graded deceleration and deflection with angle correction in such a way that the beam CRT remains close to lens center, while maintaining all voltages negative (relative to the downstream beamline),
2. An apparatus for discerning the vertical position of the beam at the exit of the VEEF;
3. A method for tuning these "virtual knobs" to achieve the desired deflection and focus, while maintaining the beam CRT centered within the lens.

Each of the above will now be described in turn.
   1. Method for Assigning Electrode Voltages
      a. Grading the Deceleration The first electrode not tied to the input beamline (numbered 1 in FIG. 5) is known as the suppression electrode, as it suppresses upstream beam plasma electrons from being stripped from the beam. Between this suppression electrode and the final ground electrode, the energy of the beam is reduced according to the potentials on the electrodes 2-5. This grading of the deceleration field affects the net focus of the beam, as well as the residual energy contamination (EC). According to the disclosed method, this grading is described by a power law, embodied by a single parameter, alpha, as defined by Eq. 2 below $$E_{crt}(0) = E_0 \qquad \text{Eq. 2}$$
$$E_{crt}(i = 1 \ldots 6) = E_f + (E_0 - E_f + eV_s)\left(\frac{(6-i)}{5}\right)^\alpha$$

where i=index describing the location along the lens, $E_{crt}$=Energy of ions on the crt at each point I, $E_f$=final energy of the beam, $E_0$=initial energy of the beam, $V_s$=potential on the crt at the location of the suppression electrode, and e=charge of electron.

Figure 6:
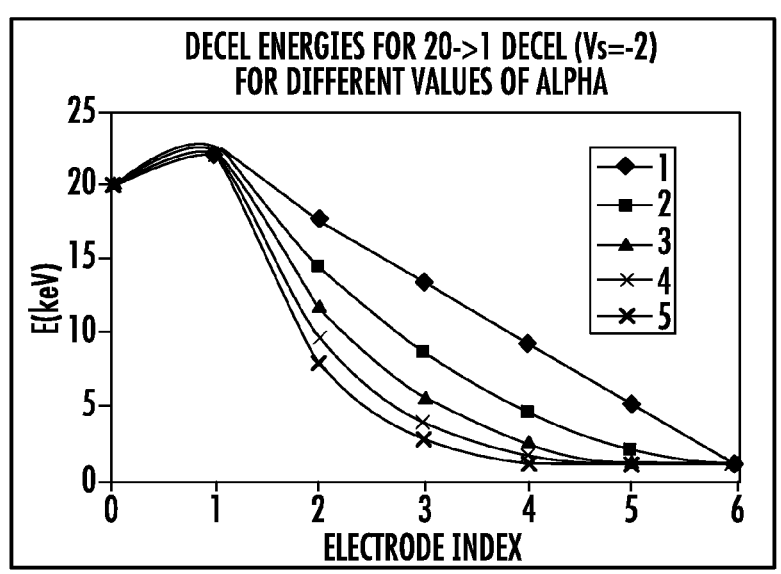
FIG. 6 is a graph of ion beam energy vs. electrode position for the graded lens of FIG. 5.

Thus, from Eq. 2, if α=1, the energy of the ions on the crt varies linearly from $E_0+eV_s$ to $E_f$, whereas if α>1, the energy drops more quickly, as exemplified in FIG. 6. In general, a large α decelerates the beam quickly, reducing the chance of high energy neutralized ions from reaching the wafer (i.e. resulting in low EC), while a small α results in greater focusing of the beam.

b. Deflection Angle Correction

Arcuate Motion

Figure 7:
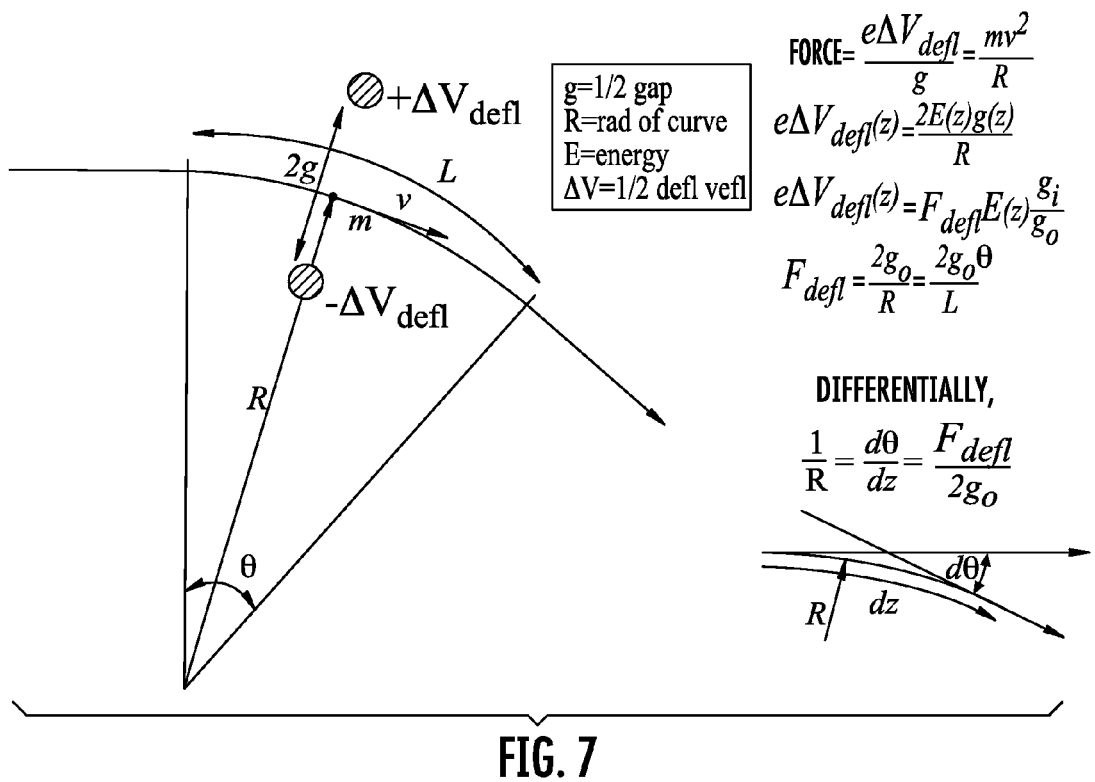
FIG. 7 is a geometric representation of arcuate motion of an ion beam produced by the graded lens of FIG. 5.

The difference in voltage between the inner and outer electrodes provides an electric field perpendicular to the particle's motion, therefore producing a localized circular, or arcuate motion (see FIG. 7). The radius of curvature and length of the arc (and therefore the net deflection angle) must conform to the geometry of the lens in order for the beam to remain centered between the inner and outer electrodes, thereby minimizing aberrations and the coupling between focus and deflection.

Figure 8:
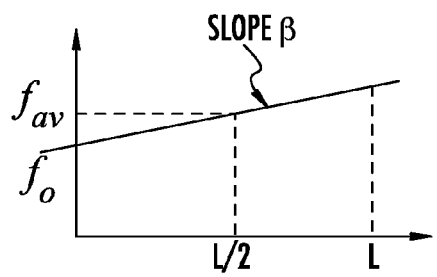
FIG. 8 is a graph showing the change in the radius of curvature of the ion beam's deflection along the length of the lens of FIG. 5.

If $F_{defl}$ is constant over the length of the VEEF, the beam's central ray trajectory (CRT) would be perfectly circular, resulting in a net deflection angle θ over its length L. It is desirable to be able to fine tune the net deflection angle to accommodate variations in input beam alignment and effects of space-charge, while causing minimum deviation from this arcuate motion. According to the method of this invention, this is done by adjusting the radius of curvature of the beam's deflection linearly along the length of the lens. Thus the single parameter $F_{defl}$ is replaced by 2 parameters: the average value $f_{av}$ and the slope β of $F_{defl}$. (See FIG. 8 and Eq. 3 below)

$$F_{defl}(z) = f_0 + \beta z \qquad \text{Eq. 3}$$
$$= f_{av} - \frac{\beta L}{2} + \beta z$$

At each point along the deflection path, the differential deflection is $$d\theta = \frac{F_{defl}}{2g_0}dz = \frac{1}{2g_0}(f_0 + \beta z)dz \qquad \text{Eq. 4}$$

Integrating this between 0 and z gives the net deflection θ(z)

$$\theta(z) = \int_0^z \frac{1}{2g_0}(f_0 + \beta z')dz' = \frac{f_0}{2g_0}z + \frac{\beta}{4g_0}z^2 \qquad \text{Eq. 5}$$

The vertical displacement is related to the angular deflection by $$dy(z) = \tan(\theta(z))dz \qquad \text{Eq. 6}$$

$$y(z) = \int_0^z \left(\frac{f_0}{2g_0}z' + \frac{\beta}{4g_0}z'^2\right)dz' = \frac{f_0}{4g_0}z^2 + \frac{\beta}{12g_0}z^3$$

Thus at the exit of the lens (of length L), $$\theta(L) = \frac{L}{2g_0}\left(f_0 + \frac{\beta L}{2}\right) = \frac{L}{2g_0}f_{av}, \quad f_{av} \equiv f_0 + \frac{\beta L}{2} \qquad \text{Eq. 7}$$

$$y(L) = \frac{L^2}{4g_0}\left(f_0 + \frac{\beta L}{3}\right) = \frac{L^2}{4g_0}f_{av} - \frac{L^3}{24g_0}\beta \qquad \text{Eq. 8}$$

FIGS. 9A and 9B show ion beam trajectories through a VEEF, demonstrating the affect of varying $f_{av}$ and β over a lens of length L=150 mm. Varying $f_{av}$ alone affects both the final angle as well as position of the beam, while varying β alone affects only the position, leaving the final angle invariant.

By varying both $f_{av}$ and β together, the net deflection angle can be varied while leaving the vertical position invariant at some point along the beam's trajectory $Z_c$. The required constraint between $f_{av}$ and β to achieve this can be found by considering the total differentials:

$$dy(Z_c) = \frac{\partial y}{\partial f_{av}}df_{av} + \frac{\partial y}{\partial \beta}d\beta = \frac{Z_c^2}{4g_0}df_{av} - \frac{Z_c^3}{24g_0}d\beta \qquad \text{Eq. 9}$$

Constraining the position at the exit of lens (dy(L)=0), one obtains the relationship between a desired change in the net deflection angle θ(dθ), and the needed changes in $f_{av}$ and β($df_{av}$, $df_{av}$):

$$dy(L) = \frac{\partial y}{\partial f_{av}}df_{av} + \frac{\partial y}{\partial \beta}d\beta = \frac{L^2}{4g_0}df_{av} - \frac{L^3}{24g_0}d\beta = 0 \qquad \text{Eq. 10}$$

$$d\beta = \frac{6}{L}df_{av}, df_{av} = \frac{2g_0}{L}d\theta$$

Figure 10:
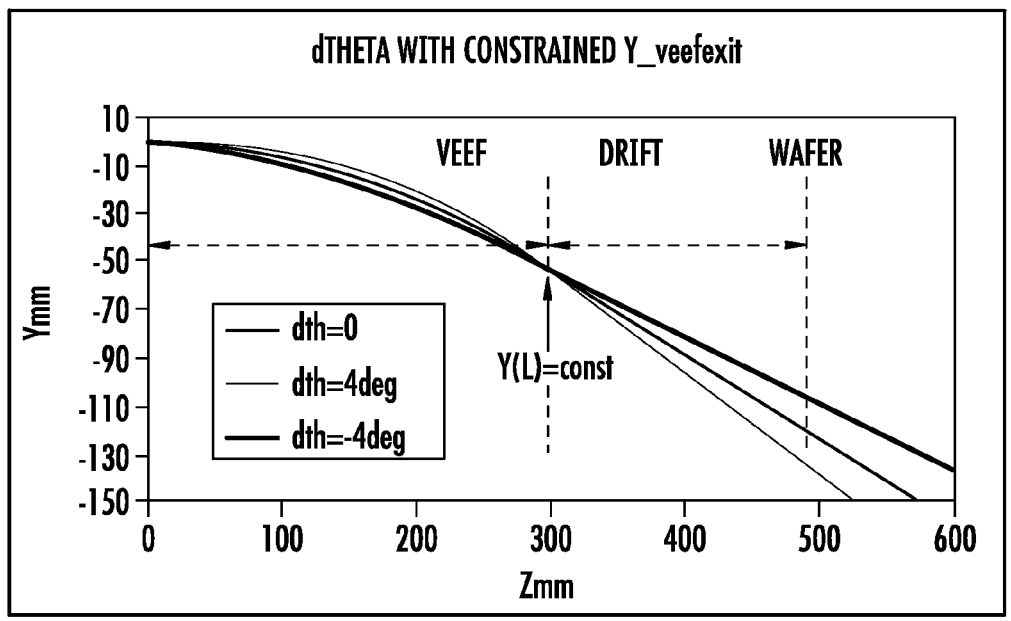
FIG. 10 is a graph of different ion beam paths with varied deflection angles.

Thus, $F_0$ ($=f_{av}$ when β=0) and $\theta_{cor}$ (=dθ in eq. 11), can be specified such that if the deflection takes place between electrodes 2-6 within the VEEF (FIG. 4), the deflection $F_{defl}(i)$ factor at the location of these electrodes would be:

$$F_{defl}(i = 2 \ldots 6) = f_{av} - \beta\frac{L}{2} + \beta dz*i \quad (dz = L/6) \qquad \text{Eq. 12}$$

$$F_{defl}(1, 7) = 0$$

$$f_{av} = F_0 + df_{av} = \frac{2g_0}{L}\theta_{cor} \qquad \text{Eq. 13}$$

$$\beta = \frac{12g_0}{L^2}\theta_{cor}$$

where,

FIG. 10 shows different beam paths with varied $\theta_{cor}$ (dth in FIG. 10), with y constrained at the VEEF exit (L=300 mm in the figure).

Alternatively, the position can be constrained further downstream (e.g., a distance D from the exit of the VEEF while changing the net deflection within the VEEF by dθ, which translates to moving the position at the exit of the VEEF by −dθD.

$$dy(L) = \frac{\partial y}{\partial f_{av}}df_{av} + \frac{\partial y}{\partial \beta}d\beta = \frac{L^2}{4g_0}df_{av} - \frac{L^3}{24g_0}d\beta = -d\theta D \qquad \text{Eq. 14}$$

$$d\beta = \frac{6}{L}df_{av} + \frac{24g_0}{L^3}d\theta, df_{av} = \frac{6g_0}{L}d\theta$$

Thus the dependence of $\beta$ on $\theta_{cor}$ in Eq. 13 would change to $$\beta = \frac{12g_0}{L^2}\theta_{cor} + \frac{24g_0 D}{L^3}\theta_{cor} \qquad \text{Eq. 15}$$

Figure 11:
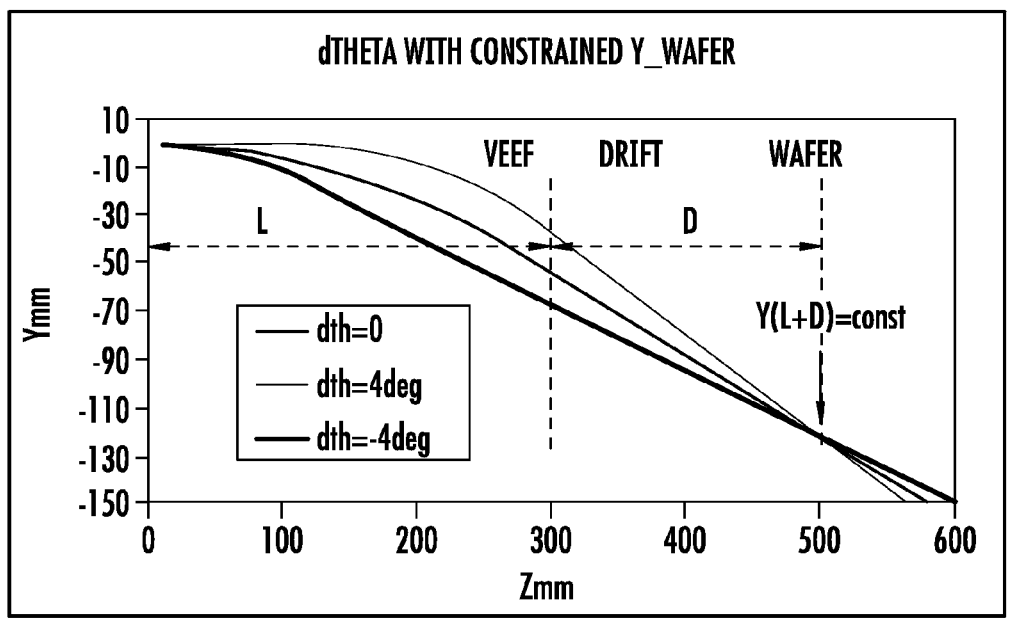
FIG. 11 is a graph of different ion beam paths with varied $d\theta$, with y constrained at a distance D from the lens exit.

FIG. 11 shows different beam paths with varied de, with y constrained at a distance D from lens exit.

c. Assigning the Deflection Potentials

Figure 12:
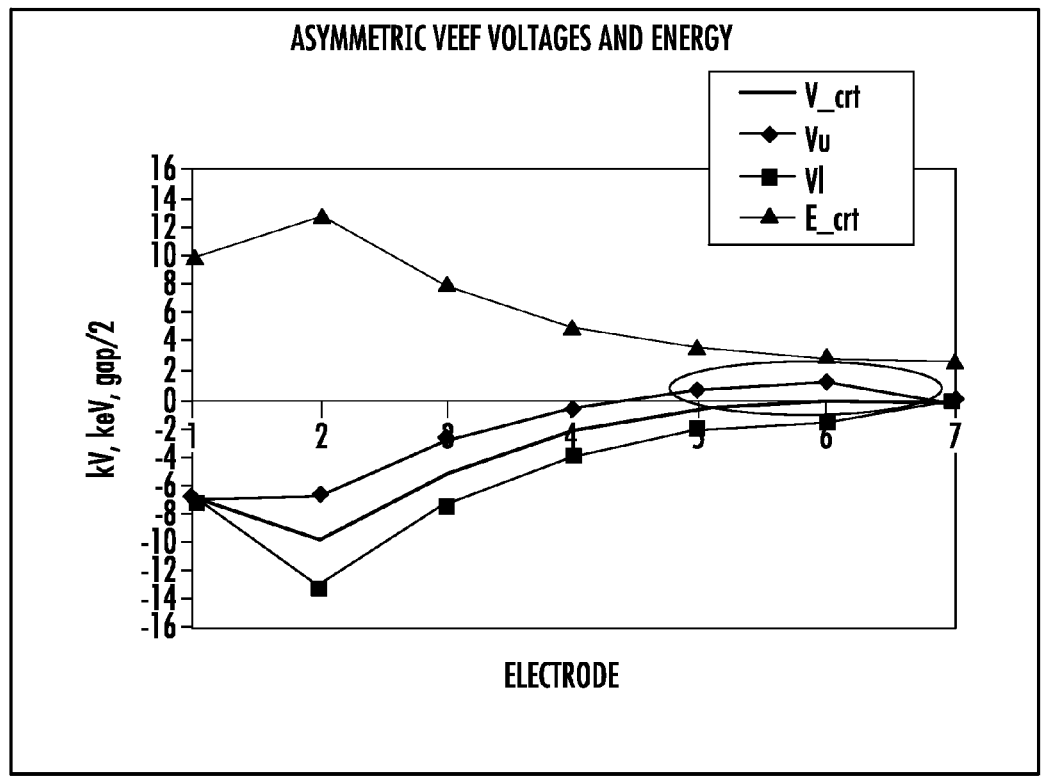
FIG. 12 is a graph illustrating blow up of an ion beam due to failure of electron suppression.

After specifying the $F_0$ and $\theta_{cor}$ (along with the appropriate constraint—y at exit or y at wafer), the electrode voltages are assigned on the upper and lower electrodes to achieve the desired arcuate motion. As was shown in FIG. 7, the electrode voltages are determined by the deflection factor at that position along the beam's CRT, according to:

$$V_{\substack{inner \\ outer}}(z) = V_{crt} \mp F_{defl} E_{crt}(z) \frac{g(z)}{g_0} \qquad \text{Eq. 16}$$

where $V_{crt}$ is calculated according to Eq. 2, using $V_{crt} = E_f - E_{crt}$. However, according to Eq. 16, it is possible for the outer electrodes to go positive, which can cause a failure of electron suppression (causing beam blow-up before or after the deceleration lens), as is exemplified in FIG. 12, which shows how the outer electrode potentials at the end of the VEEF can become positive, thereby stripping electrons from the downstream beam plasma.

The following constraints are therefore added:
1. All outer electrodes voltages remain below the downstream beamline potential (usually 0);
2. The outer suppression electrode remains below the upstream beamline potential. (This can also be a requirement of the power supply architecture, since the suppression supply is generally referenced to the upstream beamline.)

Constraint 1 can be satisfied by subtracting a fixed potential, $\delta V$, along the CRT (at every point). Since $\delta V$ increases the energy of the beam, it is calculated to satisfy the following condition:

$$V_{outer}(z) = V_{crt}(z) + F_g(z)(E + \delta V) - \delta V \leq 0, \qquad \text{Eq. 17}$$

$$F_g = F_{defl} g(z)/g_0$$

$$\delta V \geq \frac{V_{crt} + F_g E}{(1 - F_g)}$$

$\delta V$ is subtracted from $V_{crt}$ obtained from Eq. 2, and the upper and lower electrode voltages are calculated according to Eq. 13.

Constraint 2 can be satisfied by specifying the outer suppression voltage to be greater than 0, rather than specifying the suppression voltage on the CRT. That is, Eq. 13 can be used to calculate $V_{s,crt}$ from the specified $V_{s,upper}$. Note that one usually specifies a (positive) suppression power supply value $V_{S,VF}$, which is referenced to $V_0$ (the potential of the upstream beam line); i.e. $V_{S,VF} \equiv V_0 - V_{s,upper}$.

$$V_{s,upper} = V_{s,crt} + F_g(E_0 + V_{s,crt}) \quad F_g = F_{defl} \frac{g_s}{g_0} \qquad \text{Eq. 18}$$

$$-V_{S,VF} = (V_{s,upper} - V_0) = -V_{s,crt} + F_g E_0 + F_g V_{s,crt}$$

-continued $$V_{s,crt} = \frac{(-V_{S,VF} - F_g E_0)}{(F_g - 1)}$$

This calculated $V_{s,crt}$ is used in the alpha algorithm to specify $E_{crt}$ (note $V_{s,crt} = V_{crt}(1) = V_0 - E_{crt}(1)$).

Virtual Knobs

For a specified input beam to the decel/deflect lens, and specified energy deceleration of the lens, the power supplies that control the potentials on the electrodes within the lens control the focus and deflection of the beam. According to the disclosed method, these power supplies are controlled by the following "virtual knobs":

(1) Alpha—controls the beam's focus, as well as residual energy contamination;

(2) Vs—controls the upstream electron suppression, preventing electrons from being stripped from the upstream beam;

(3) $F_0$—controls the deflection of the beam, used to center the beam at the exit of the lens (with $\theta_{cor}$=0);

(4) $\theta_{cor}$—provides fine-tune of the final deflection angle of the beam while constraining the position at the exit of the lens 2. Apparatus for Centering Beam at Exit of Deflect Lens It would be advantageous to be able to tune $F_0$ in order to center the beam at the exit of the deflect lens. Such dynamic tuning may be important due to slight variations in the alignment of the input beam, and effects of space charge.

Approach 1: Use Final Ground Electrodes as Current Sensors

Figure 13:
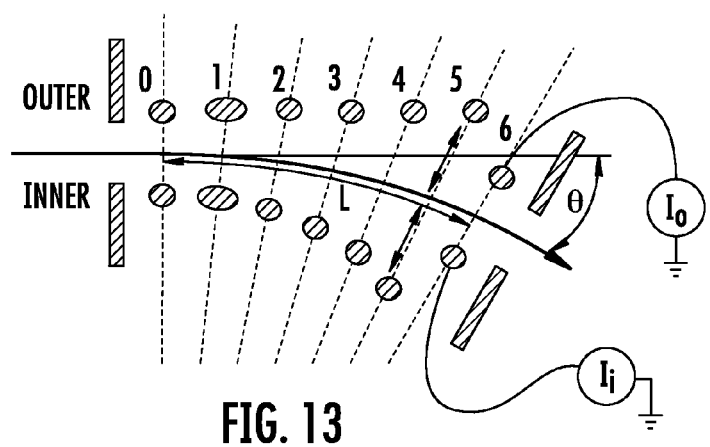
FIG. 13 is a is a geometric representation of an exemplary graded lens configuration in which Fo is varied to result in Ii and Io being equal.

By measuring the currents on the inner and outer final ground electrodes, the beam can be centered by varying $F_0$ until $I_i$ and $I_o$ are equal (see FIG. 13). If the beam is too narrow to produce current on both final ground electrodes, $F_0$ can be varied until the two values of $F_0$ that achieve the same current on the electrodes is reached, and then set $F_0$ between these two values.

Approach 2: Use Collimated Light Sensor Vertically Centered Within The Exit Aperture An ion beam travelling through residual gas produces light (as the residual gas molecules are excited and relax back their ground states). This can be used to measure the vertical position of the beam.

As shown in FIG. 14, The light sensor can be made very sensitive by employing CCD (charge-coupled device) or ICCD (intensified charge-coupled device) which can be capable of "single photon" detection. A 1-dimensional array of CCDs can be used to obtain the vertical profile of the beam. By taking the image without the beam, any background light (for example from a downstream plasma flood gun) could be subtracted out.

3. Methods for Tuning the "Virtual Knobs"

Method 1: Using $\theta_{cor}$ with Constrained Position at Exit of VEEF

The deceleration ratio, $\alpha$, and $V_s$, are set to achieve the desired energy, current, and focus of the final beam. The process for determining these values are described in U.S. patent application Ser. No. 12/348,091, filed Jan. 2, 2009, titled, "Techniques for Independently Controlling Deflection, Deceleration and Focus of an Ion Beam." The $F_0$ parameter is set to achieve a centered beam at the exit of the VEEF. This is done by tuning $F_0$ while discerning the vertical position of the beam at the exit of the VEEF using one of the two approaches described above (current sensors on final ground electrodes, or centered light sensor). Once this it done, the beam can then be centered at the wafer plane using $\theta_{cor}$ (with vertical position constrained at the exit of VEEF). This ensures that the beam is both centered at the exit of the VEEF and that the VEEF is excited at the correct angle (i.e. the bend angle at which the beamline is set). The centering of the beam at the wafer plane is accomplished using a two-dimensional profiler, or other known technique for sensing the vertical position of the beam.

Method 1a: Using $\theta_{cor}$ with Constrained Position at Exit of VEEF and Measuring Both Position and Angle at the Wafer Plane It is advantageous to use the parameter $\theta_{cor}$ (with constrained position at exit of VEEF) to tune the position of the beam even if the vertical position of the beam is not directly discerned at the exit of the VEEF. Two parameters are measured to be able to set both $\theta_{cor}$ and $F_0$ to their optimal values. In this method, both the beam's average vertical position Y and average vertical angle Y' are measured at the wafer plane. The response or sensitivities of these parameters to varying $\theta_{cor}$ and $F_0$ are shown for a particular case in FIGS. 15A and 15B, and can clearly be seen to be linear.

The partial derivatives can be determined experimentally with just 3 points.

$$m_{y\theta} = \frac{\partial Y}{\partial \theta} = \frac{Y_2 - Y_1}{\theta_2 - \theta_1}$$ Eq. 19

$$m_{y'\theta} = \frac{\partial Y'}{\partial \theta} = \frac{Y'_2 - Y'_1}{\theta_2 - \theta_1}$$

$$m_{yF} = \frac{\partial Y}{\partial F} = \frac{Y_2 - Y_1}{F_2 - F_1}$$

$$m_{y'F} = \frac{\partial Y'}{\partial F} = \frac{Y'_2 - Y'_1}{F_2 - F_1}$$

Using these, a general expression for Y(F, θ) and Y'(F, θ) can be obtained:

$$Y(F,\theta) = m_{y\theta}(\theta - \theta_1) + m_{yF}(F - F_1) + Y_1$$

$$Y'(F,\theta) = m_{y'\theta}(\theta - \theta_1) + m_{y'F}(F - F_1) + Y'_1$$ Eq. 20

Which when set=0 yields the values of F and θ needed to center the beam both at the wafer and at the exit of the VEEF:

$$m_{y\theta}\theta + m_{yF}F = m_{y\theta}\theta_1 + m_{yF}F_1 - Y_1 \equiv C$$

$$m_{y'\theta}\theta + m_{y'F}F = m_{y'\theta}\theta_1 + m_{y'F}F_1 - Y'_1 \equiv C'$$ Eq. 21

Solving these for F and θ:

$$\theta_{tuned} = \frac{Cm_{y'F} - m_{yF}C'}{m_{y\theta}m_{y'F} - m_{yF}m_{y'\theta}}$$ Eq. 22

$$F_{tuned} = \frac{m_{y\theta}C' - Cm_{y'\theta}}{m_{y\theta}m_{y'F} - m_{yF}m_{y'\theta}}$$

Method 2: Using $\theta_{cor}$ with Constrained Position at the Wafer Plane

The deceleration ratio, α, and $V_s$, are set to achieve the desired energy, current, and focus of the final beam. $F_0$ is then tuned to achieve a centered beam at the wafer plane (accomplished using a two-dimensional profiler, or other known means of sensing the vertical position of the beam). The angle of the beam can then be tuned at the wafer plane to be the specified bend angle by varying $\theta_{cor}$ (with vertical position constrained at the wafer plane). This ensures that the beam is both centered at the exit of the VEEF and exiting the VEEF at the correct angle.

1. Application of the Disclosed Tuning Method to Other Lens Geometries

It will be appreciated that the disclosed method is not limited in application to any one specific lens geometry. Rather, it can be applied to applications using a variety of different lens geometries.

For any electrostatic lens combining deceleration and deflection, whether there is a single or a multiplicity of bends, it is important that the beam remain centered at the exit of the lens (where the focus is the largest) for several reasons:

(1) it minimizes aberrations, (2) it reduces the interaction between angle adjustment and focus; and (3) it maintains consistent tuning, resulting in consistent residual energy contamination.

Figure 16:
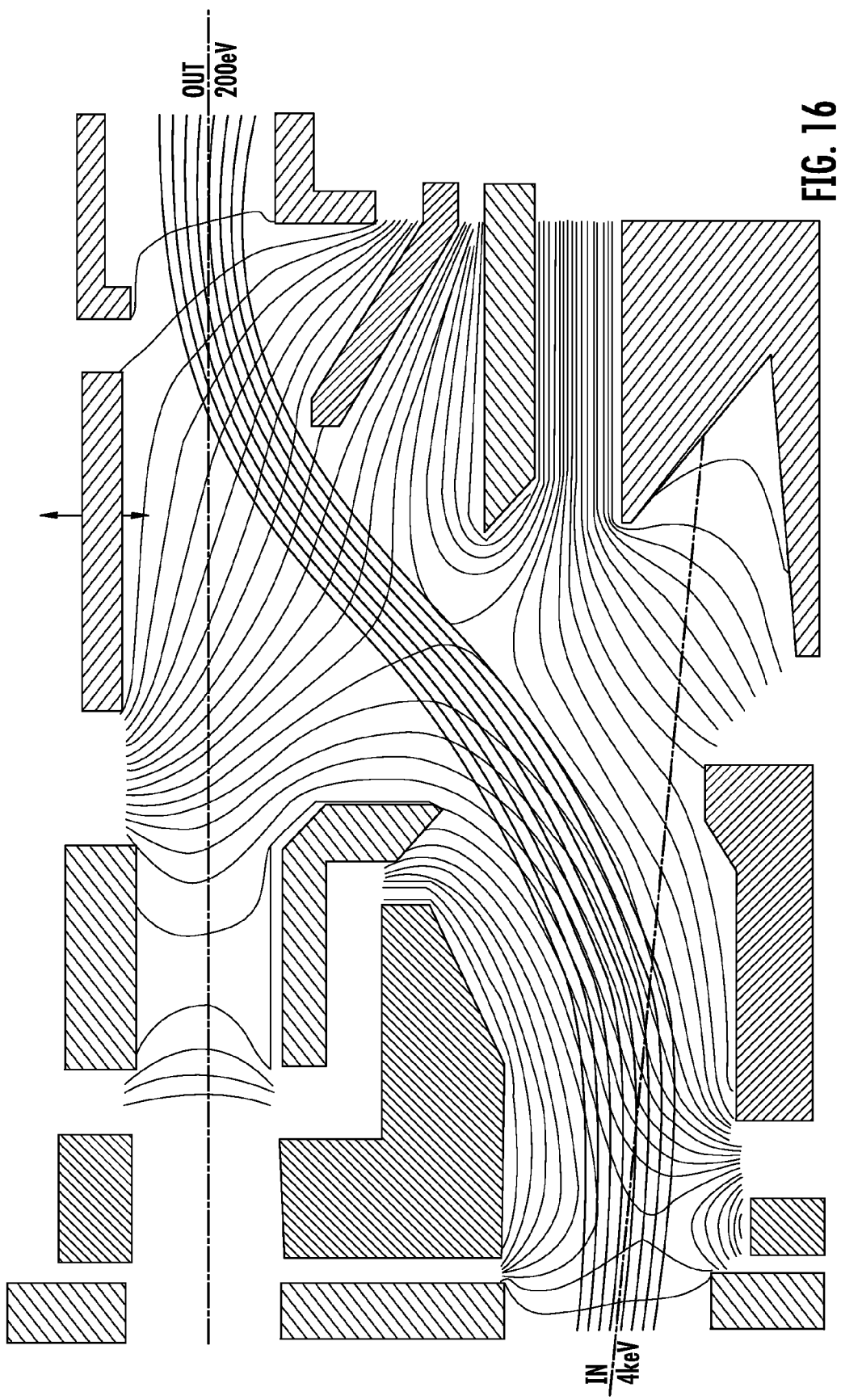
FIG. 16 is a cross-section view of deflection, deceleration and/or focus in a chicane lens configuration.

Consider the example of a "chicane lens", exemplified in FIG. 16. Since the final deceleration occurs while the beam is still being deflected, there will always be residual energy contamination due to neutrals forming within the final bend. In order to perform an adjustment of the exit beam angle, the radius of curvature of the final bend needs to be adjusted. It would be desirable to do this while maintaining the exit position of the beam, which would minimize any variation in neutral trajectories reaching the wafer. This could be accomplished by applying independent potentials on several of the final electrodes (and perhaps adding more electrodes), accomplishing simultaneous grading and deflection of the beam, and allowing the application of the tuning method described herein.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

The method described herein may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art includes such devices as a readable or writeable CD, flash memory chips (e.g., thumb drives), various magnetic storage media, and the like.

The functions and process steps herein may be performed automatically or wholly or partially in response to user command. An activity (including a step) performed automatically is performed in response to executable instruction or device operation without user direct initiation of the activity.

It will be appreciated that the systems and methods disclosed are not exclusive. Other systems and methods may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The processes and applications may, in alternative embodiments, be located on one or more (e.g., distributed) processing devices accessing a network linking the elements of the disclosed system. Further, any of the functions and steps provided in the Figures may be implemented in hardware, software or a combination of both and may reside on one or more processing devices located at any location of a network linking the elements of the disclosed system or another linked network, including the Internet.

What is claimed is:

1. A method for controlling deflection of an ion beam, comprising
providing an electrode configuration comprising a plurality of upper and lower electrode pairs, the upper and lower electrodes of each pair positioned on opposite sides of an ion beam;
grading a deceleration of the ion beam,
obtaining a deflection factor function along a length of the lens to obtain a beam angle correction; and
obtaining electrode voltages for the plurality of upper and lower electrode pairs to adjust the grading, the deflection factor, and a focus of the ion beam such that a central ray trajectory (CRT) of the ion beam is positioned at a center of the lens center;
wherein adjusting the grading and deflection factor is achieved using at least one virtual knob that adjusts at least one parameter of the ion beam.

2. The method of claim 1, wherein the at least one virtual knob controls the beam focus and residual energy contamination.

3. The method of claim 1, wherein the at least one virtual knob controls an upstream electron suppression of the ion beam, preventing electrons from being stripped from the ion beam.

4. The method of claim 1, wherein the at least one virtual knob controls a deflection of the beam, and centers the beam at the exit of the lens.

5. The method of claim 4, further comprising measuring currents on inner and outer final ground electrodes of the plurality of electrode pairs, and centering the beam by varying beam deflection until the currents on the inner and outer final ground electrodes are equal.

6. The method of claim 4, further comprising providing a collimated light sensor vertically centered within an exit aperture of the lens to determine beam centering.

7. The method of claim 1, wherein the at least one virtual knob controls a final deflection angle of the ion beam and constrains the position of the ion beam at the exit of the lens.

8. The method of claim 1, wherein the step of grading a deceleration of the ion beam further comprises calculating the energy of the beam's central ray trajectory (CRT) along a length of the lens.

9. The method of claim 1, wherein electrode voltages are assigned to the upper and lower electrode pairs such that voltages of outer electrodes of the plurality of upper and lower electrode pairs remain negative.

10. The method of claim 1, wherein an outer suppression electrode of the plurality of electrodes remains below an upstream beamline potential.

11. A system for controlling deflection of a charged particle beam, comprising
a graded lens comprising a plurality of sets of electrodes, each set of electrodes spaced apart by a gap to allow a charged particle beam to pass therebetween;
a controller for controlling different combination of voltage potentials to be applied to the plurality of sets of electrodes; and
a machine readable storage medium encoded with a computer program code such that, when the computer program code is executed by a processor, the processor performs a method comprising:
grading a deceleration of the ion beam,
obtaining a deflection factor function along a length of the lens to obtain a beam angle correction; and
obtaining electrode voltages for the plurality of upper and lower electrode pairs to adjust the grading, the deflection factor, and a focus of the ion beam such that a central ray trajectory (CRT) of the ion beam is positioned at a center of the lens center;
wherein adjusting the grading and deflection factor is achieved using at least one virtual knob that adjusts at least one parameter of the ion beam.

12. The system of claim 11, wherein the at least one virtual knob controls the beam focus and residual energy contamination.

13. The system of claim 11, wherein the at least one virtual knob controls an upstream electron suppression of the ion beam, preventing electrons from being stripped from the ion beam.

14. The system of claim 11, wherein the at least one virtual knob controls a deflection of the beam, and centers the beam at the exit of the lens.

15. The system of claim 14, further comprising instructions for measuring currents on inner and outer final ground electrodes of the plurality of electrode pairs, and centering the beam by varying beam deflection until the currents on the inner and outer final ground electrodes are equal.

16. The system of claim 14, further comprising instructions for providing a collimated light sensor vertically centered within an exit aperture of the lens to determine beam centering.

17. The system of claim 11, wherein the at least one virtual knob controls a final deflection angle of the ion beam and constrains the position of the ion beam at the exit of the lens.

18. The system of claim 11, wherein the step of grading a deceleration of the ion beam further comprises calculating the energy of the beam's central ray trajectory (CRT) along a length of the lens.

19. The system of claim 11, wherein electrode voltages are assigned to the upper and lower electrode pairs such that voltages of outer electrodes of the plurality of upper and lower electrode pairs remain negative.

* * * * *